United States Patent
Deshayes et al.

(10) Patent No.: US 10,374,403 B2
(45) Date of Patent: Aug. 6, 2019

(54) ELECTRICAL POWER DISTRIBUTION BOX FOR AN AIRCRAFT

(71) Applicant: ZODIAC AERO ELECTRIC, Montreuil (FR)

(72) Inventors: Olivier Deshayes, Montreuil (FR); Frédéric Pinard, Montreuil (FR); Arnaud Badault, Montreuil (FR); Julien Giron, Montreuil (FR)

(73) Assignee: ZODIAC AERO ELECTRIC, Montreuil (FR)

( * ) Notice: Subject to any disclaimer, the term of this patent is extended or adjusted under 35 U.S.C. 154(b) by 0 days.

(21) Appl. No.: 15/878,316

(22) Filed: Jan. 23, 2018

(65) Prior Publication Data

US 2018/0219363 A1    Aug. 2, 2018

(30) Foreign Application Priority Data

Jan. 24, 2017 (FR) ...................................... 17 00062
Jun. 13, 2017 (FR) ...................................... 17 55298

(51) Int. Cl.
| | | |
|---|---|---|
| *H02G 3/08* | (2006.01) | |
| *B64D 41/00* | (2006.01) | |
| *H05K 7/14* | (2006.01) | |
| *H02B 1/34* | (2006.01) | |

(52) U.S. Cl.
CPC ............. *H02G 3/081* (2013.01); *B64D 41/00* (2013.01); *H02B 1/34* (2013.01); *H02G 3/086* (2013.01); *H05K 7/1457* (2013.01); *B64D 2041/002* (2013.01); *B64D 2221/00* (2013.01)

(58) Field of Classification Search
CPC .......... H02G 3/08; H02G 3/081; H02G 3/086; H05K 5/00; H05K 5/02; H05K 7/1457; H05K 5/0004; H05K 5/0217; H05K 5/0247; H05K 5/0269; H05K 7/1418; B64D 41/00; B64D 2041/002; B64D 2221/00
USPC .......... 174/50, 520, 559, 542, 254; 361/600, 361/601, 602, 727, 724, 725, 752
See application file for complete search history.

(56) References Cited

U.S. PATENT DOCUMENTS

| | | | | |
|---|---|---|---|---|
| 4,493,010 A | * | 1/1985 | Morrison | ........... H05K 7/20636 361/701 |
| 4,962,444 A | * | 10/1990 | Niggemann | ....... H05K 7/20636 361/702 |
| 5,376,011 A | * | 12/1994 | Rudy, Jr. | .............. H05K 7/1449 439/248 |

(Continued)

FOREIGN PATENT DOCUMENTS

WO    2015124722 A1    8/2015

OTHER PUBLICATIONS

Preliminary Search Report and Written Opinion for French Patent Application No. 1755298, dated Oct. 26, 2017, 6 pages.

*Primary Examiner* — Angel R Estrada
(74) *Attorney, Agent, or Firm* — Christensen O'Connor Johnson Kindness PLLC

(57) ABSTRACT

The invention relates to an electric power distribution box for an aircraft, comprising a frame (3) containing at least one power connector (7) formed of one or more slide rails (8) that are able to interact with one end (11) of a power circuit board (9), said power circuit board (9) comprising at least one switching element (13) for an electric power distribution plate. The invention also relates to an electric power distribution assembly (1) comprising such a power distribution box.

15 Claims, 4 Drawing Sheets

(56) References Cited

U.S. PATENT DOCUMENTS

Figure 1:
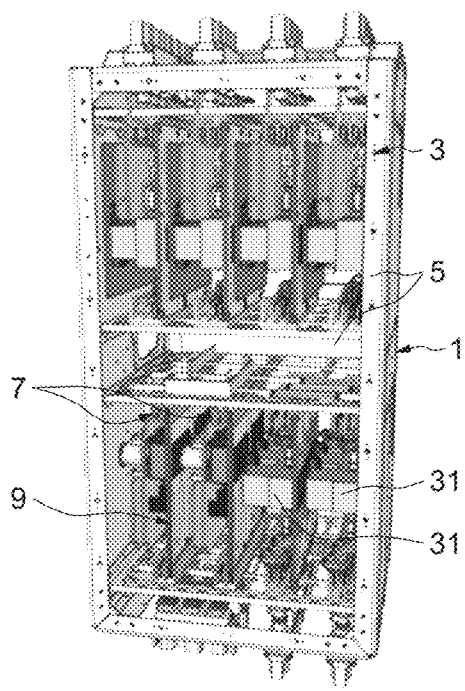

| | | | | |
|---|---|---|---|---|
| 5,467,254 A * | 11/1995 | Brusati | ............... | H05K 7/1409 |
| | | | | 174/355 |
| 6,026,565 A * | 2/2000 | Giannatto | ............ | H05K 7/1424 |
| | | | | 361/701 |
| 6,191,953 B1 * | 2/2001 | Aggus | ................. | H05K 7/1418 |
| | | | | 174/560 |
| 6,661,664 B2 * | 12/2003 | Sarno | ................ | H05K 7/20545 |
| | | | | 361/700 |
| 6,775,143 B2 * | 8/2004 | Yen | ..................... | H05K 7/1492 |
| | | | | 361/727 |
| 6,937,461 B1 * | 8/2005 | Donahue, IV | ....... | H01R 13/514 |
| | | | | 174/50 |
| 7,031,171 B2 * | 4/2006 | Marcotte | ............. | H05K 7/1408 |
| | | | | 174/359 |
| 7,307,851 B2 * | 12/2007 | Dimarco | ............. | H05K 7/1407 |
| | | | | 361/752 |
| 7,508,670 B1 * | 3/2009 | Thorson | ............ | H05K 7/20636 |
| | | | | 361/689 |
| 8,023,267 B2 * | 9/2011 | Streyle | ............... | H05K 7/20545 |
| | | | | 174/547 |
| 8,222,541 B2 * | 7/2012 | Vander Ploeg | ........ | H02G 13/00 |
| | | | | 174/382 |
| 8,976,525 B2 * | 3/2015 | de Bock | ............ | H05K 7/20172 |
| | | | | 361/690 |
| 2009/0273234 A1 | 11/2009 | Wavering et al. | | |

* cited by examiner

ELECTRICAL POWER DISTRIBUTION BOX FOR AN AIRCRAFT

The invention relates to an electric power distribution box for an aircraft and to an electric power distribution assembly comprising such a power distribution box.

Primary distribution forms part of the electrical system of an aircraft, such as an aeroplane. It makes it possible to distribute and protect the electric power from internal sources, such as generators and batteries, or external sources, such as the ground power unit, to the useful loads of the aircraft.

The primary distribution assembly is made up of a power and electronics component.

Nowadays, the power component, comprising one or more power circuit boards, also called power plates, is integrated at the bottom of the frame in the distribution box. The electronic boards are generally mounted perpendicular to the power circuit board.

There is a need to reduce the weight and the bulk of the assembly formed by the distribution box including the frame, by the electronic boards and by the power circuit boards.

According to a first aspect, one subject of the invention is an electric power distribution box for an aircraft, comprising a frame containing at least one power connector formed of one or more slide rails that are able to interact with one end of a power circuit board, said power circuit board comprising at least one switching element for an electric power distribution plate.

According to particular embodiments of the invention, the box of the invention may comprise one or more of the following features, taken alone or in any possible combination:
- the frame contains two power connectors that are arranged so as to receive, by sliding, the two ends of one and the same power circuit board, thereby making it possible to assist with the insertion and the installation of the power circuit board;
- a power connector includes at least one power elastic compression means configured to constrain the end of the power circuit board received in said connector, thereby making it possible to ensure electrical contact;
- the power elastic compression means is a power strip configured to allow the power circuit board to be held and to allow heat dissipation;
- the power connector(s) are fixed to the frame by a fixing means, in particular a screw and/or nut;
- the connector(s) are configured to receive one or more cables coming from the aircraft.

According to another aspect, another subject of the invention is an electric power distribution assembly comprising a box of the invention and at least one power circuit board comprising at least one switching element for an electric power distribution plate, said circuit board having an end that is able to interact, by sliding, with a connector of the box.

The power circuit board preferably includes a cold plate linked directly to the frame of the distribution box.

The power box preferably includes a plurality of connectors linked to one another by busbars.

The assembly of the invention preferably furthermore comprises at least one electronic board, said at least one electronic board and said at least one power circuit board having a substantially identical height and are arranged in parallel with one another, thereby making it possible to increase the compactness of the distribution assembly.

The invention thus makes it possible:
- to optimize the integration of the power distribution assembly by virtue of the power circuit boards that are slidable or mountable in the distribution box,
- to modularize the power component of the distribution box,
- to free up the intermediate portion of the frame of the box of the invention in order to install connection interfaces, in particular dedicated low-level signal interfaces, and therefore to separate the power connections from the low-level ones.

Figure 2:
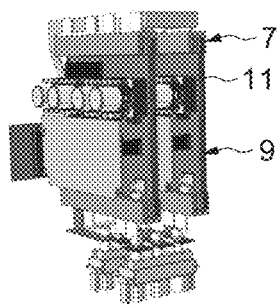
Figure 3A:
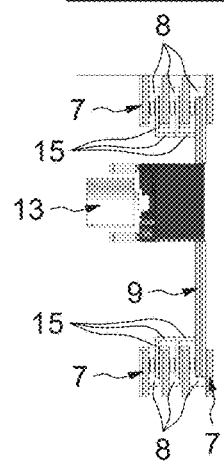
Figure 3B:
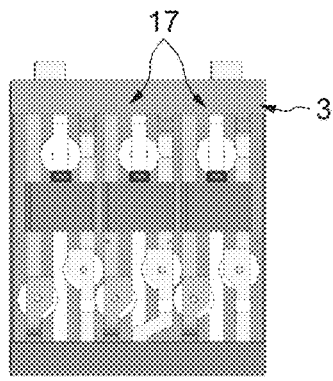
Figure 4:
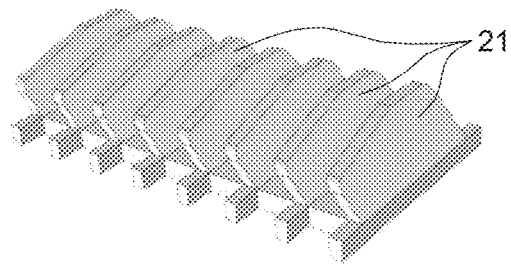
Figure 5:
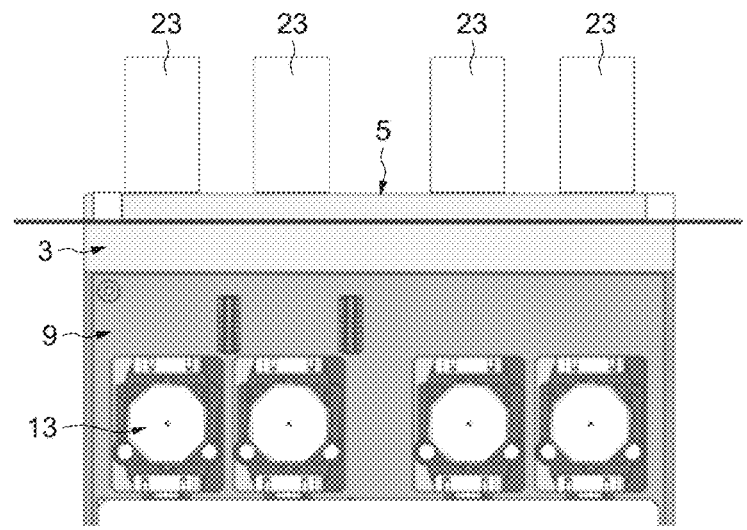
Figure 6:
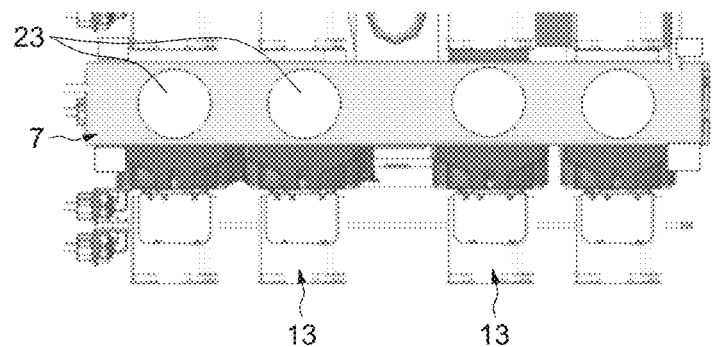
Figure 7:
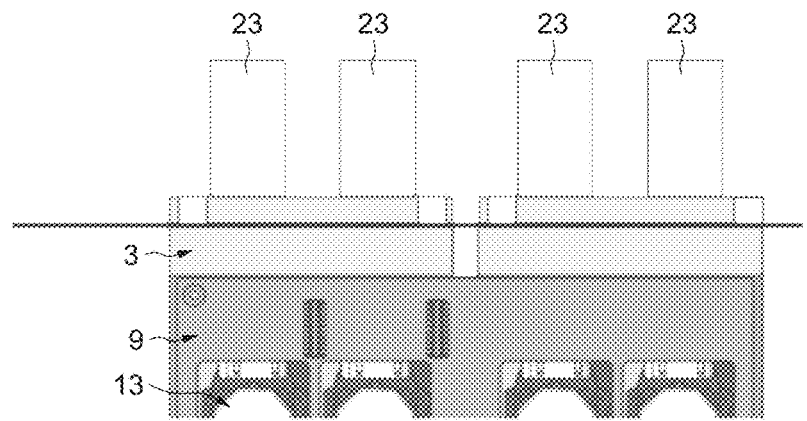
Figure 8:
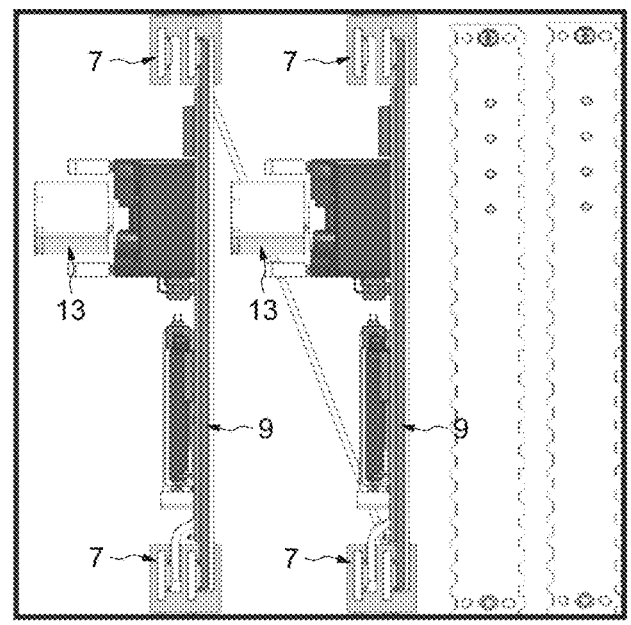
Figure 9:
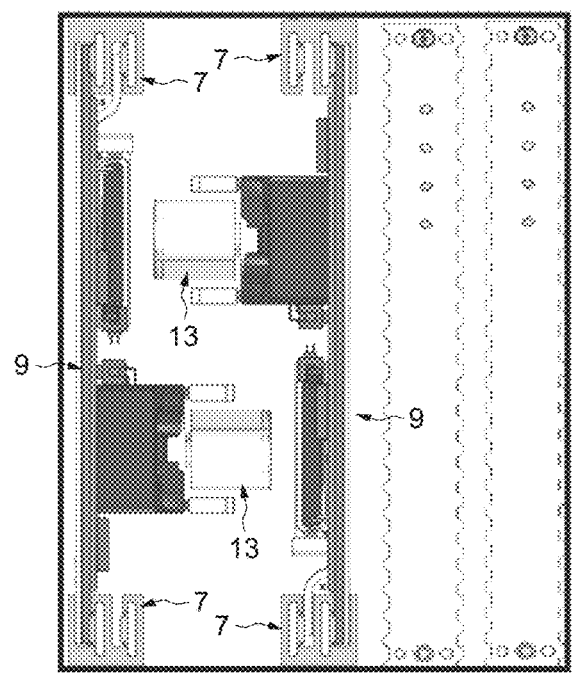
Figure 10:
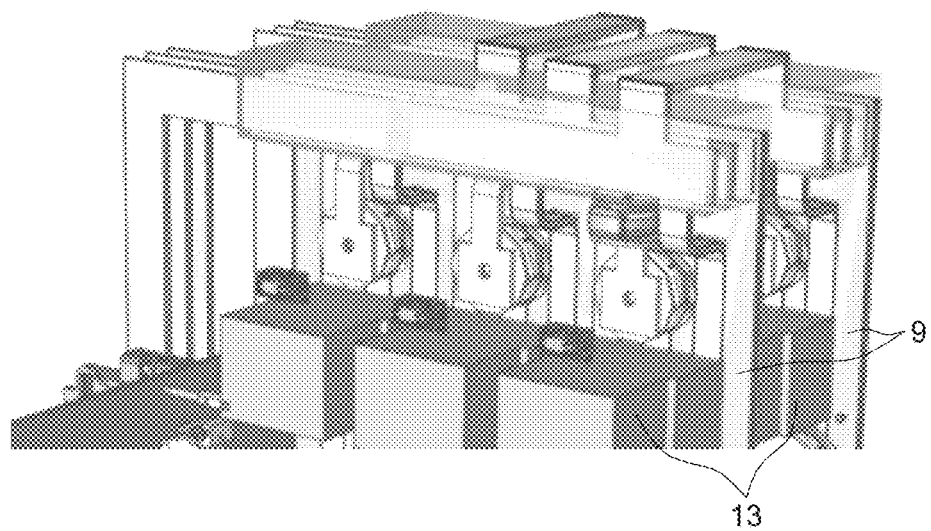
Figure 11:
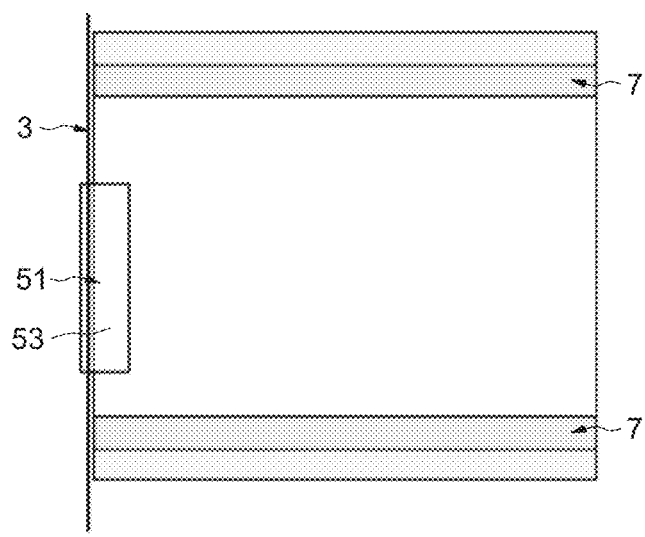

Other aims, features and advantages of the invention will become apparent on reading the following description, which is given solely by way of non-limiting example and with reference to the appended drawings, in which:

FIG. 1 is a perspective front view of an embodiment of a distribution assembly of the invention, FIG. 2 is a perspective side view of two power circuit boards of the distribution assembly of FIG. 1, FIG. 3a is a side view of a three-phase power circuit board according to the embodiment of FIG. 2, FIG. 3b is a rear view of the circuit board of the embodiment of FIG. 3a, FIG. 4 is a perspective side view of an embodiment of power strips, FIG. 5 is a schematic partial front view of a wired power circuit board with a connector according to the embodiment of FIG. 2, FIG. 6 is a schematic partial side view of the circuit board of FIG. 5, FIG. 7 is a schematic partial front view of a variant of the circuit board of FIG. 5 with two connectors, FIGS. 8 and 9 are two schematic partial views of an assembly of the invention with two different positions of the power circuit boards, FIG. 10 is a schematic perspective view of the distribution bars of an assembly according to the invention, FIG. 11 is a schematic partial cross section of a box frame of the assembly according to the invention.

As illustrated in the figures, the electric power distribution assembly 1 of the invention comprises:
- an electric power distribution box 3 for an aircraft, comprising a frame 5 containing at least one power connector 7 formed of one or more slide rails 8 that are able to interact with one end 11 of a power circuit board 9,
- said power circuit board 9 comprising at least one switching element 13 for an electric power distribution plate.

The connector 7 is configured such that the slide rail(s) 8 receive one or more bars 15 of the distribution circuit board at the end 9 of said circuit board depending on the number of phases.

Thus, for a three-phase AC contactor, the number of distribution bars of the circuit board 9 is three, and the connector includes three slide rails 8.

The power connector(s) 7 may be fixed to the frame 3 by a fixing means, in particular a screw or nut. Such fastening allows the wiring coming from the aircraft, termed 'aircraft harness', to be connected directly to the power circuit board.

The power circuit board 9 may be taken from the power circuit boards described in patent application FR1557879 filed on Aug. 24, 2015.

The power circuit board 9 may advantageously include a cold plate 17 linked directly to the frame 3 of the distribution box.

Contact between the cold plate 17 and the frame 3 may be brought about by pressing a compression means, such as power strips 21, one or more screws or a slide rail system, such as the Calmark™ system.

The power strip 21 may be configured to allow the power circuit board to be held, the electrical connection and heat transfer from the power circuit board to the distribution bars and/or the structure of the aircraft, for improved heat dissipation of the assembly.

The power strip 21 contacts may be superimposed so as to allow a larger electrical contact area between the power circuit board 9 and the output busbars 41. If a three-phase AC contactor is involved, the contact area may be equal, for the three contacts, to the area of the contactor.

Said contact area and the size of the power strips 21 allow the conduction of heat between the distribution bars 41 and/or with the structure of the aircraft in order to evacuate the flow of heat.

The power connector(s) 7 may be fixed to the frame 3.

The connector(s) 7 may be configured to receive one or more cables coming from the aircraft.

The aircraft cable(s) 23 may be fixed to the connector 7, in particular by crimping.

The assembly 1 according to the invention may advantageously furthermore comprise at least one electronic board 31, said at least one electronic board 31 and said at least one power circuit board 9 having a substantially identical height and are arranged in parallel with one another, thereby making it possible to increase the compactness of the assembly of the invention.

In this case, the power circuit boards 9 may be positioned such that the switching elements are positioned in the same direction (see FIG. 8) or facing one another (see FIG. 9).

The power box of the invention may advantageously include a plurality of connectors 7 linked to one another by busbars 41.

The frame 3 may contain two power connectors 7 that are arranged so as to receive, by sliding, two ends 11 of one and the same power circuit board 9, thereby making it possible to assist with the insertion and the installation of the power circuit board 9.

A power connector 7 may include at least one power elastic compression means (not shown) configured to constrain the end 11 of the power circuit board 9 received in said connector 7, thereby making it possible to ensure electrical contact.

As shown in FIG. 11, the assembly of the invention makes it possible to free up the intermediate portion of the frame 51 of the box of the invention in order to install connection interfaces 53, in particular dedicated low-level signal interfaces, and therefore to separate the power connections from the low-level ones.

The invention claimed is:

1. An electric power distribution box for an aircraft, comprising: a frame comprising at least one power connector formed of one or more slide rails, the one or more slide rails being configured to interact with an end of a power circuit board, the power circuit board comprising a switching element for an electric power distribution plate.

2. The electric power distribution box according to claim 1, wherein the frame comprises two power connectors that are configured to receive, by sliding, two ends of the power circuit board.

3. The electric power distribution box according to claim 1, wherein a power connector comprises a power elastic compression means configured to constrain the end of the power circuit board received in said connector.

4. The electric power distribution box according to claim 3, wherein the power elastic compression means is a power strip configured to hold the power circuit board and to allow heat dissipation.

5. The electric power distribution box according to claim 1, wherein each of the at least one power connectors is fixed to the frame by a fixing means.

6. The electric power distribution box according to claim 1, wherein each of the at least one power connectors is configured to receive one or more cables coming from the aircraft.

7. An electric power distribution assembly comprising an electric power distribution box according to claim 1 and at least one power circuit board, the at least one power circuit board comprising at least one switching element for an electric power distribution plate, the at least one power circuit board having an end that is configured to interact, by sliding, with one power connector of the electric power distribution box.

8. The electric power distribution assembly according to claim 7, wherein the at least one power circuit board comprises a cold plate linked directly to the frame of the electric power distribution box.

9. The electric power distribution assembly according to claim 7, wherein the at least one power connector comprises a plurality of power connectors, the plurality of power connectors being linked to one another by a plurality of busbars.

10. The electric power distribution assembly according to claim 7, further comprising at least one electronic board, at least one electronic board and the at least one power circuit board having a substantially identical height and being arranged in parallel with one another.

11. The electric power distribution assembly according to claim 7, wherein each of the one or more slide rails is configured to receive at least one bar of the power circuit board.

12. The electric power distribution assembly of claim 11, wherein each of the at least one power connectors is configured to receive at least two bars of the power circuit board.

13. The electric power distribution assembly of claim 11, wherein at least one of the power connectors includes a number of slide rails equal to a phase of the at least one power circuit board, and the at least one power circuit board includes a number of bars equal to its phase.

14. An electric power distribution assembly, comprising:
an electric power distribution box having a frame with a first power connector formed at least partially from a plurality of slide rails; and
a power circuit board comprising a switching element for an electric power distribution plate, the power circuit board having an end configured to slidably engage the first power connector of the electric power distribution box,
wherein the plurality of slide rails is configured to thermally communicate and to electrically communicate with the power circuit board when the power circuit board is slidably engaged with the first power connector.

15. The electric power distribution assembly of claim 14, further comprising a second power connector configured to electrically communicate with the first power connector via a busbar.

* * * * *